United States Patent
Zhang (10) Patent No.: US 10,312,931 B2
(45) Date of Patent: Jun. 4, 2019

(54) PROGRAMMABLE GAIN AMPLIFIER AND A DELTA SIGMA ANALOG-TO-DIGITAL CONVERTER CONTAINING THE PGA

(71) Applicant: Texas Instruments Incorporated, Dallas, TX (US)

(72) Inventor: Jun Zhang, Shanghai (CN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/877,098

(22) Filed: Jan. 22, 2018

(65) Prior Publication Data

US 2019/0089367 A1 Mar. 21, 2019

Related U.S. Application Data

(63) Continuation of application No. PCT/CN2017/102780, filed on Sep. 21, 2017.

(51) Int. Cl.
| | |
|---|---|
| *H03G 3/20* | (2006.01) |
| *H03M 1/18* | (2006.01) |
| *H03G 1/00* | (2006.01) |
| *H03F 1/38* | (2006.01) |
| *H03M 3/00* | (2006.01) |

(52) U.S. Cl.
CPC ............. *H03M 1/185* (2013.01); *H03F 1/38* (2013.01); *H03G 1/0088* (2013.01); *H03G 3/20* (2013.01); *H03M 1/187* (2013.01); *H03M 3/464* (2013.01)

(58) Field of Classification Search
CPC .... H03G 3/20; H03G 3/30; H03F 1/56; H03F 3/45

USPC ............... 330/86, 282, 284, 69, 144
See application file for complete search history.

(56) References Cited

U.S. PATENT DOCUMENTS

| | | | | |
|---|---|---|---|---|
| 4,467,286 A | * | 8/1984 | Stitt ........................ | H03H 7/24 330/84 |
| 7,843,261 B2 | * | 11/2010 | Schaffer ............... | H03G 1/0088 330/144 |
| 9,112,465 B2 | | 8/2015 | Dey et al. | |

(Continued)

FOREIGN PATENT DOCUMENTS

EP 2498400 A1 9/2012

OTHER PUBLICATIONS

International Search Report for PCT/CN2017/102780 dated May 30, 2018.

*Primary Examiner* — Steven J Mottola
(74) *Attorney, Agent, or Firm* — Kenneth Liu; Charles A. Brill; Frank D. Cimino (57) ABSTRACT

A programmable gain amplifier includes an operational amplifier and a resistor network coupled to the output node of the operational amplifier. The resistor network includes a first plurality of resistors coupled in series between the output node and a first network node. A second plurality of resistors is coupled in series between the first network node and a second network node. A unit resistor is coupled in parallel with the second plurality of resistors between the first and second resistor network nodes and a third plurality of resistors is coupled in parallel between the second resistor network node and a reference voltage. Each resistor of the second and third pluralities of resistors comprises a unit resistor. The third plurality of resistors contains N resistors and the second plurality of resistors contains (N−1) resistors.

15 Claims, 9 Drawing Sheets

(56) References Cited

U.S. PATENT DOCUMENTS

2010/0001792 A1  1/2010  Lo et al.
2015/0084693 A1  3/2015  Larson

* cited by examiner

PROGRAMMABLE GAIN AMPLIFIER AND A DELTA SIGMA ANALOG-TO-DIGITAL CONVERTER CONTAINING THE PGA

FIELD OF THE DISCLOSURE

Disclosed embodiments relate generally to the field of programmable gain amplifiers (PGAs). More particularly, and not by way of any limitation, the present disclosure is directed to a programmable gain amplifier and a delta sigma analog-to-digital converter (ADC) containing a PGA.

BACKGROUND

The Common Mode Rejection Ratio (CMRR) for a PGA is determined by the matching between the resistors around the output amplifier. Existing designs can require large areas and/or offer poor performance to achieve a wide range of selectable gain. Improvements are needed in the PGA design to improve performance and required area.

SUMMARY

Disclosed embodiments provide a resistor network that can be utilized in a feedback loop. When incorporated into a feedback loop, the resistor network uses less equivalent resistance than many previous resistor networks to achieve the same gain. The solution can reduce the number of the critical matching devices so that the CMRR and PGA gain error performance are improved. Compared to some existing designs utilizing the same unit resistor, the disclosed resistor network can achieve lower power consumption and compared to some existing designs utilizing the same drive current, the disclosed resistor network can be provided on a smaller die area and improve matching. Thermal noise produced by the resistor network can be reduced due to the lower equivalent resistance of the resistor network.

In one aspect, an embodiment of a programmable gain amplifier is disclosed. The PGA includes a first operational amplifier comprising a first non-inverting input node, a first inverting input node and a first output node; and first resistor network coupled to the first output node, the first resistor network comprising: a first plurality of resistors coupled in series between the first output node and a first resistor network node; a second plurality of resistors coupled in series between the first resistor network node and a second resistor network node; a first unit resistor coupled in parallel with the second plurality of resistors between the first resistor network node and the second resistor network node; and a third plurality of resistors coupled in parallel between the second resistor network node and a reference voltage, wherein each resistor of the second plurality of resistors and of the third plurality of resistors comprises a unit resistor and further wherein the third plurality of resistors contains a number N of resistors and the second plurality of resistors contains (N−1) resistors.

In another aspect, an embodiment of an electronic device is disclosed. The electronic device includes a first operational amplifier having a first inverting input node and a first non-inverting input node and being further coupled to provide a first output signal on a first output node; a second operational amplifier having a second inverting input node and a second non-inverting input node and being further coupled to provide a second output signal on a second output node, each of the first and second operational amplifiers being coupled to receive a respective one of a pair of differential signals on a respective non-inverting input; and a resistor network having a first terminal coupled to the first inverting input node and a second terminal coupled to the second inverting input node, the resistor network comprising a first plurality of resistors coupled in series between the first output node and a first resistor network node; a second plurality of resistors coupled in series between the first resistor network node and a second resistor network node; a first unit resistor coupled in parallel with the second plurality of resistors between the first resistor network node and the second resistor network node; and a third plurality of resistors coupled in parallel between the second resistor network node and a reference voltage, wherein each resistor of the second plurality of resistors and of the third plurality of resistors comprises a unit resistor and further wherein the third plurality of resistors contains a number N of resistors and the second plurality of resistors contains (N−1) resistors.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 7:
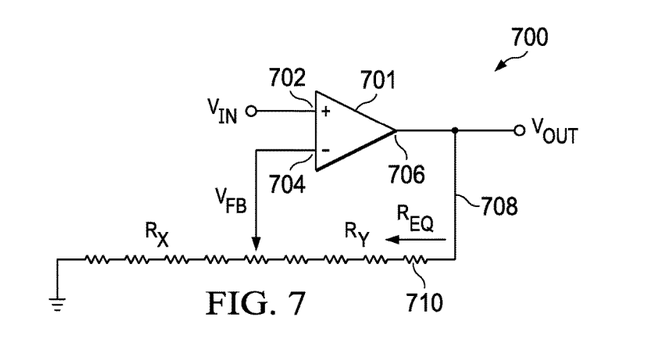
FIG. 7 depicts generalized schematic of a PGA.

FIG. 7 depicts a generalized version of a PGA 700. As shown, PGA 700 includes an operational amplifier 701, which has a non-inverting input node 702, an inverting input node 704 and an output node 706. PGA 700 receives an input signal $V_{IN}$ on non-inverting input 702 and provides an output signal $V_{OUT}$ on output node 706. A feedback loop 708 feeds the output voltage $V_{OUT}$ to a variable resistor 710 and provides at least a portion of $V_{OUT}$ to inverting input node 704 as feedback voltage $V_{FB}$. The equivalent voltage of variable resistor 710 is given by $R_{EQ}$ and the point from which the feedback voltage $V_{FB}$ is taken divides the resistance $R_{EQ}$ into $R_x$ and $R_y$, as shown. As is known, the gain, G, of PGA 700 is given by the equation:

$$G = \left(1 + \frac{R_Y}{R_X}\right) \qquad \text{Equation 1}$$

The drive current $I_{DRIVE}$ is given by the equation:

$$I_{DRIVE} = \frac{V_{OUT}}{R_X + R_Y} \qquad \text{Equation 2}$$

Figure 1A:
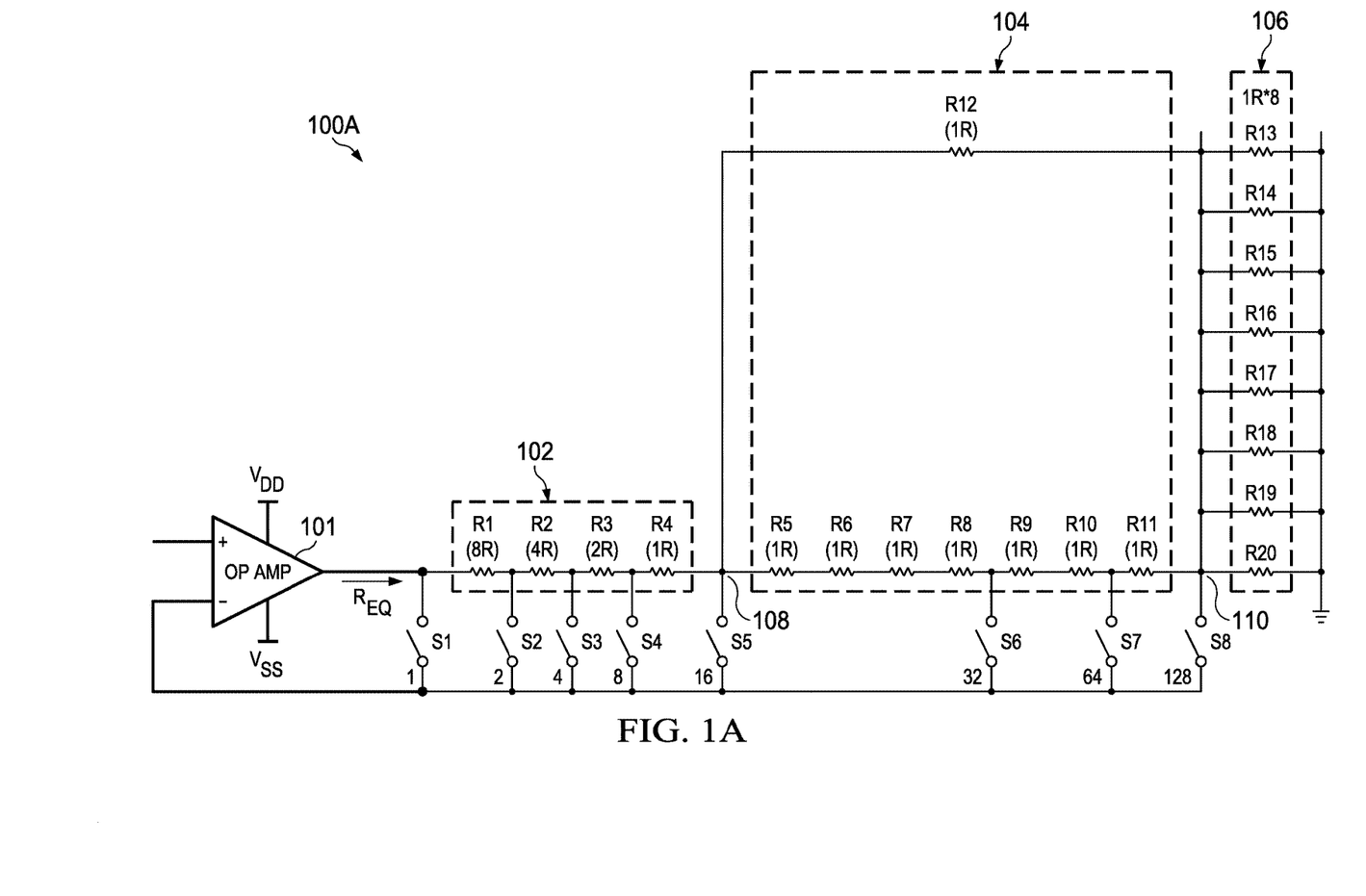
FIG. 1A depicts an implementation of a single-ended PGA according to an embodiment of the disclosure.
Figure 1B:
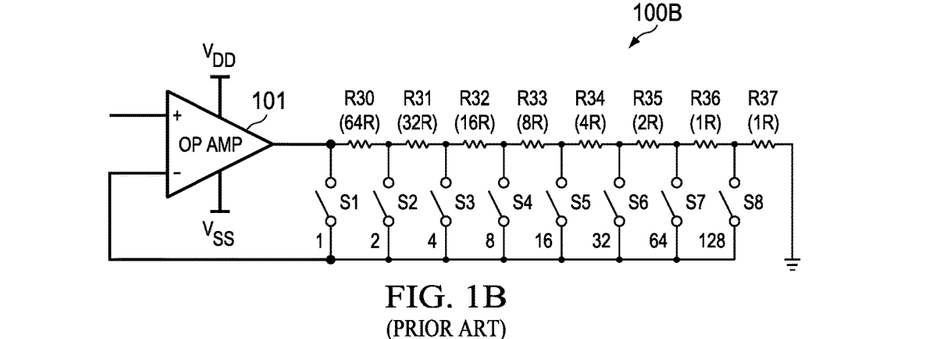
FIG. 1B depicts a prior art implementation of a single-ended PGA having the same programmable gain as in FIG. 1A.

FIG. 1B depicts a single-ended PGA 100B capable of providing gain having a selected value between 1 and 128 according to the prior art. In PGA 100B, a series of resistors R30-R37 are coupled in series between the output node of operational amplifier 101 and the lower rail, with switches S1-S8 coupled to tap the series of resistors R30-R37 before and after each resistor. Resistor R30 has a resistance of 64R, with R being a constant value selected for the application; resistor R31 has a resistance of 32R; resistor R32 has a resistance of 16R; resistor R33 has a resistance of 8R; resistor R34 has a resistance of 4R; resistor R35 has a resistance of 2R; and resistors R36, R37 each have a resistance of 1R.

PGA 100B requires the equivalent of 128 unit resistors, a sum of the individual resistances (R) of all of the resistors in the feedback loop. In accordance with Equation 1; each successive resistor in this embodiment doubles the gain of PGA 100B. When switch S1 is closed, the entire output voltage $V_{OUT}$ is provided to the feedback loop and PGA 100B has a gain of 1. When switch S2 is closed, the gain is 2; when switch S3 is closed, the gain is 4. Similarly, closing switch S4 gives a gain of 8; closing switch S5 gives a gain of 16; closing switch S6 provides a gain of 32; closing switch S7 provides a gain of 64; and closing switch S8 provides a gain of 128.

In comparing different PGAs, several numbers are of interest, such as the resistance of a unit resistor $R_{UNIT}$ (shown as simply R in the figures), the total resistance in the feedback loop, i.e., the sum of the values of all of the resistors in the feedback loop, which determines the size of the feedback loop when implemented in silicon, and the equivalent resistance $R_{EQ}$, which is the actual resistance experienced by the overall feedback loop at maximum gain. $R_{EQ}$ can be calculated using the following formula:

$$I_{DRIVE} = V_{OUT}/R_{EQ} \qquad \text{Equation 3}$$

For example, when designed to operate with an output voltage $V_{OUT}$ of 0.5 V and a drive current of 100 µA, $R_{EQ}$ is equal to 0.5V/0.0001 A or 5 kohm. To work in the design of PGA 100B, $R_{UNIT}$ is 39.0625 ohms. Using a value of $R_{UNIT}$ that is less than 40 ohms does not allow any leeway for process variation during silicon processing. This specific design combination is therefore not suitable for industrial silicon design.

The $R_{UNIT}$ for this design can, of course, be designed to be larger and more suitable for industrial processes. For example, if $R_{UNIT}$ is set to 500 ohms, with $V_{OUT}$ remaining equal to 0.5 V, the equivalent resistance is $128*R_{UNIT}$ or 64 kohms, $R_{TOTAL}$ is also $128*R_{UNIT}$ or 64 kohms and $I_{DRIVE}$ is 7.8125 µA. The embodiment of PGA 100B requires a large area for the implementation of the resistors but provides only poor performance.

Figure 1C:
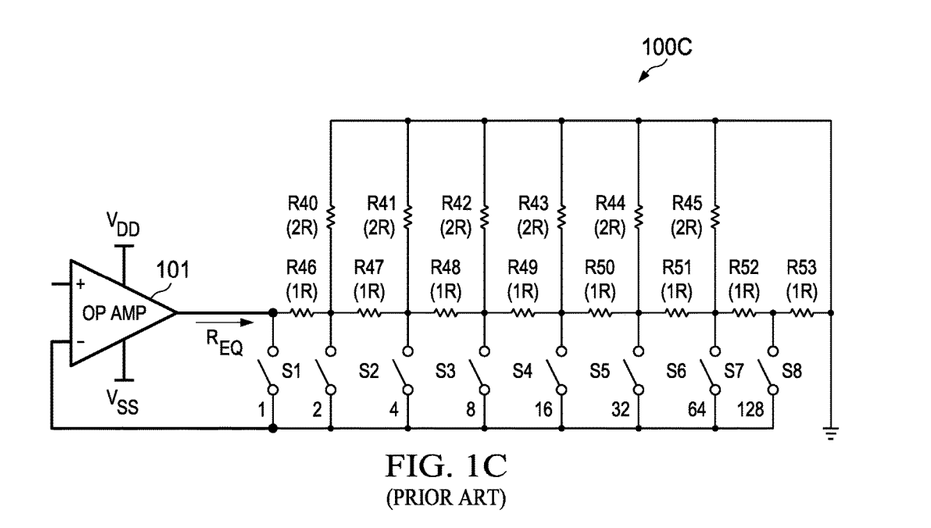
FIG. 1C depicts a second prior art implementation of a single-ended PGA having the same programmable gain as in FIG. 1A.

An alternate prior art embodiment that provides a programmable gain between 1 and 128 is shown in FIG. 1C. In PGA 100C, the resistor network includes a set of resistors R46-R53, which are coupled in series, each of resistors R46-R53 having a resistance of 1R. A second set of resistors R40-R45 are also provided, each having a resistance of 2R. Each of resistors R40-R45 has a first terminal coupled between a pair of resistors in the set of resistors R46-R53 and a second terminal coupled to the lower rail. That is, resistor R40 has a first terminal coupled between resistors R46 and R47 and a second terminal coupled to the lower rail; resistor R41 has a first terminal coupled between resistors R47 and R48; resistor R42 has a first terminal coupled between resistors R48 and R49; resistor R43 has a first terminal coupled between resistors R49 and R50; resistor R44 has a first terminal coupled between resistors R50 and R51; and resistor R45 has a first terminal coupled between resistors R51 and R52.

Switches S1-S8 are coupled to tap the series of resistors R46-R53 before each successive resistor. As in the previous example, closing a successive switch from left to right doubles the gain, so that closing switch S1 provides a gain of 1, closing switch S2 provides a gain of 2, switch S3 provides a gain of 4; closing switch S4 provides a gain of 8; closing switch S5 provides a gain of 16; closing switch S6 provides a gain of 32; closing switch S7 provides a gain of 64; and closing switch S8 provides a gain of 128.

PGA 100C requires the equivalent of 20 unit resistors. If the same drive current of 100 µA as in the previous example is utilized with $V_{OUT}$ equal to 0.5 V, $R_{UNIT}$ is equal to 2.5 kohms, $R_{EQ}$ is equal to $2*R_{UNIT}$ or 5 kohms and $R_{TOTAL}$ is equal to $20*R_{UNIT}$ or 50 kohms. Thus, this embodiment requires a large area for implementation under this first set of conditions. If a unit resistance of 500 ohms is utilized instead, $R_{EQ}$ is 1 kohm, $I_{DRIVE}$ is 500 µA and $R_{TOTAL}$ is 10 kohms. This embodiment has high power requirements under this second set of conditions.

FIG. 1A depicts a single-ended PGA 100A capable of providing a gain of between 1 and 128 according to an embodiment of the disclosure. Three sets of resistors make up the resistor network for PGA 100A, which in this embodiment includes a first set of resistors 102 coupled in series between the output node of operational amplifier 101 and a first node 108, a second set of resistors 104 in which a number of series-coupled resistors R5-R11 are coupled in parallel with resistor R12 between first node 108 and a second node 110, and a third set of resistors 106 which are coupled in parallel between the second node 110 and the lower rail.

The first set of resistors 102 includes resistor R1 having a resistance of 8R, resistor R2 having a resistance of 4R, resistor R3 having a resistance of 2R and resistor R4 having a resistance of 1R. Switches S1-S5 are coupled to tap the series of resistors R1-R4 before and after each resistor in the first set of resistors. Switch S1 provides a gain of 1, switch S2 provides a gain of 2, switch S3 provides a gain of 4, switch S4 provides a gain of 8 and switch S5 provides a gain of 16.

The second set of resistors 104 includes resistor R12 coupled in parallel with series-coupled resistors R5-R11 between node 108 and node 110, with each of resistors R5, R6, R7, R8, R9, R10, R11, R12 being unit resistors. Switches S6, S7 and S8 are coupled respectively to a point between resistors R8/R9, to a point between resistors R10/R11 and to node 110. Switch S6 provides a gain of 32, switch S7 provides a gain of 64 and switch S8 provides a gain of 128. The third set of resistors 106 includes eight resistors R13-R20 coupled in parallel between node 110 and the lower rail, each of resistors R13, R14, R15, R16, R17, R18, R19, R20 having a resistance of 1R. The equivalent resistance of the combined second and third sets of resistors is only 1R, yet this portion of the resistor network provides three additional taps to extend the gain offered without significantly increasing the equivalent resistance of the entire network.

The thermal noise of a resistor or resistor network is determined by the following equation:

$$S_v(f) = 4kTR_{EQ}$$ Equation 4 where $S_v(f)$ is the voltage spectral density,
$k = 1.38 \times 10^{-23}$ J/K is the Boltzman constant, and
T is the absolute temperature of the resistor in Kelvin.

It can be understood from this equation that reducing the equivalent resistance of the resistor network also reduces the thermal noise provided by that resistor network. Accordingly, the layout the resistor network of PGA 100A can reduce the thermal noise as compared to at least some prior art embodiments.

PGA 100A requires 31 unit resistors. When the PGA is designed for a drive current of 100 µA and a $V_{OUT}$ of 0.5 V, $R_{UNIT}$ is equal to 312.5 ohms, $R_{EQ}$ is equal to $16*R_{UNIT}$ or 5 kohms, and $R_{TOTAL}$ is equal to $31*R_{UNIT}$ or 9.6875 kohms. If $R_{UNIT}$ is set to 500, as in the second set of previous examples, $R_{EQ}$ is equal to 8 kohms, $I_{DRIVE}$ is equal to $V_{OUT}/R_{EQ}$ or 62.5 µA and $R_{TOTAL}$ $31*R_{UNIT}$ or 15.5 kohms.

A side-by side comparison of the embodiments of PGA 100A, 100B, 100C is shown below, first with a constant drive current in Table 1 and then with a constant unit of resistance in Table 2:

TABLE 1

| PGA | $I_{DRIVE}$ (µA) | $V_{OUT}$ (V) | # Unit resistors | $R_{UNIT}$ (Ω) | $R_{EQ}$ (kΩ) | $R_{TOTAL}$ (kΩ) |
|---|---|---|---|---|---|---|
| 100A | 100 | 0.5 | 31 | 312.5 | 5 | 9.6875 |
| 100B | 100 | 0.5 | 128 | 39.0625 | 5 | 5 |
| 100C | 100 | 0.5 | 20 | 2500 | 5 | 50 |

In embodiments having the same drive current, PGA 100A requires a much small number of unit resistors compared to PGA 100B. As mentioned previously, at the voltage and drive current shown in this figure, PGA 100B is not even viable for reproduction in silicon. Additionally, PGA 100A utilizes much less area to implement the resistor array compared to PGA 100C.

TABLE 2

| PGA | $I_{DRIVE}$ (µA) | $V_{OUT}$ (V) | # Unit resistors | $R_{UNIT}$ (Ω) | $R_{EQ}$ (kΩ) | $R_{TOTAL}$ (kΩ) |
|---|---|---|---|---|---|---|
| 100A | 62.5 | 0.5 | 31 | 500 | 8 | 15.5 |
| 100B | 7.8125 | 0.5 | 128 | 500 | 64 | 64 |
| 100C | 500 | 0.5 | 20 | 500 | 1 | 10 |

Comparing the three embodiments using equal units of resistance, PGA 100A occupies much less area than PGA 100B and thus provides cost savings. PGA 100A also provides better matching with fewer matching units and less thermal noise compared with PGA 100B. Using equal units of resistance, PGA 100A requires much less power than PGA 100C due to the lower drive current.

Figure 2A:
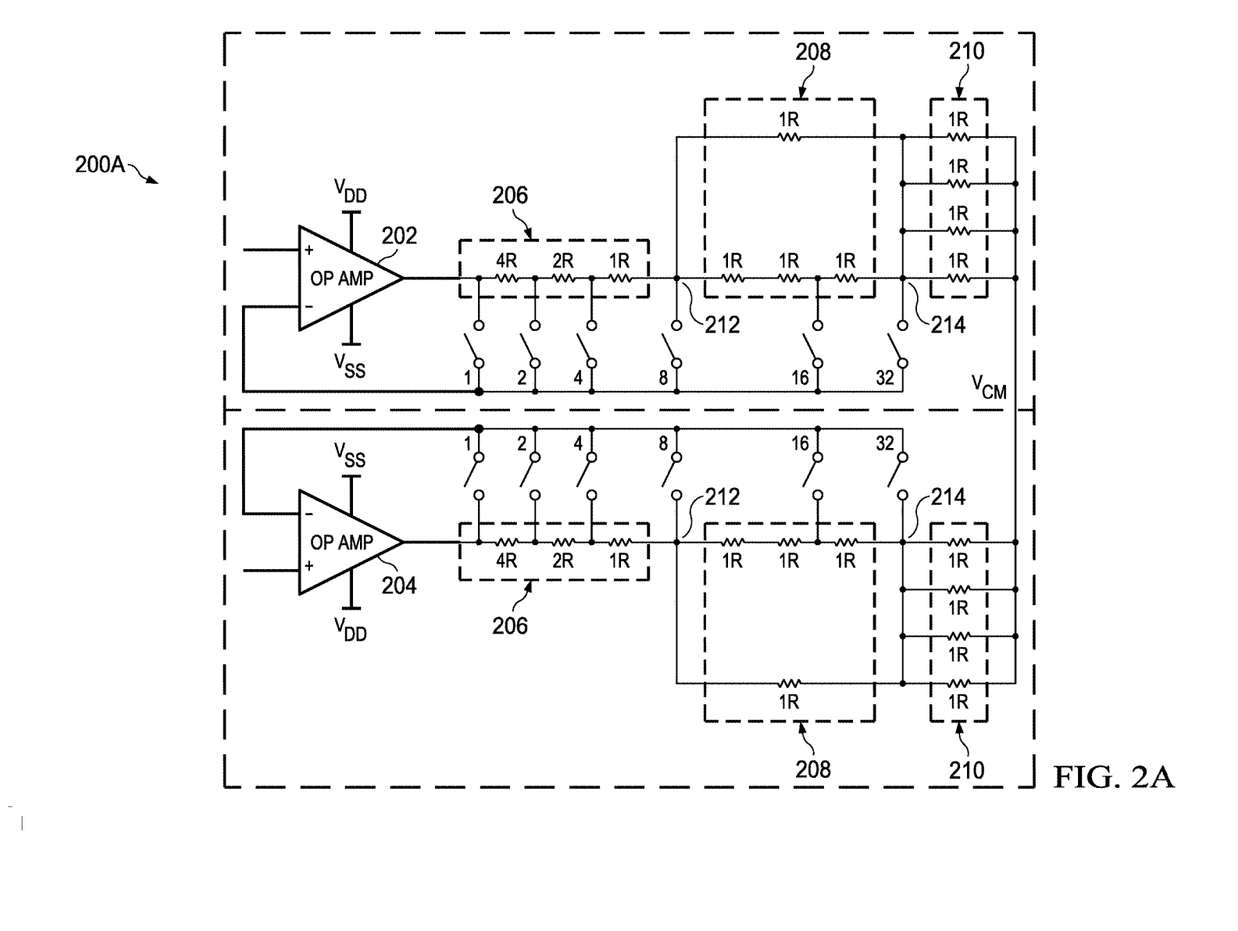
FIG. 2A depicts an implementation of a PGA according to an embodiment of the disclosure.
Figure 2B:
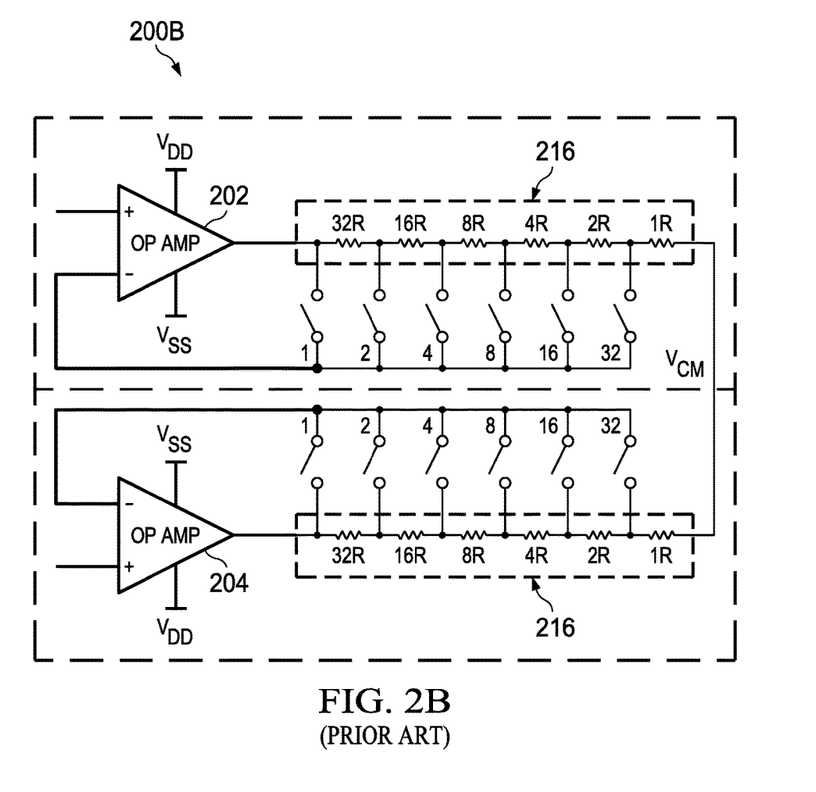
FIG. 2B depicts a prior art implementation of a PGA having the same programmable gain as in FIG. 2A.
Figure 3A:
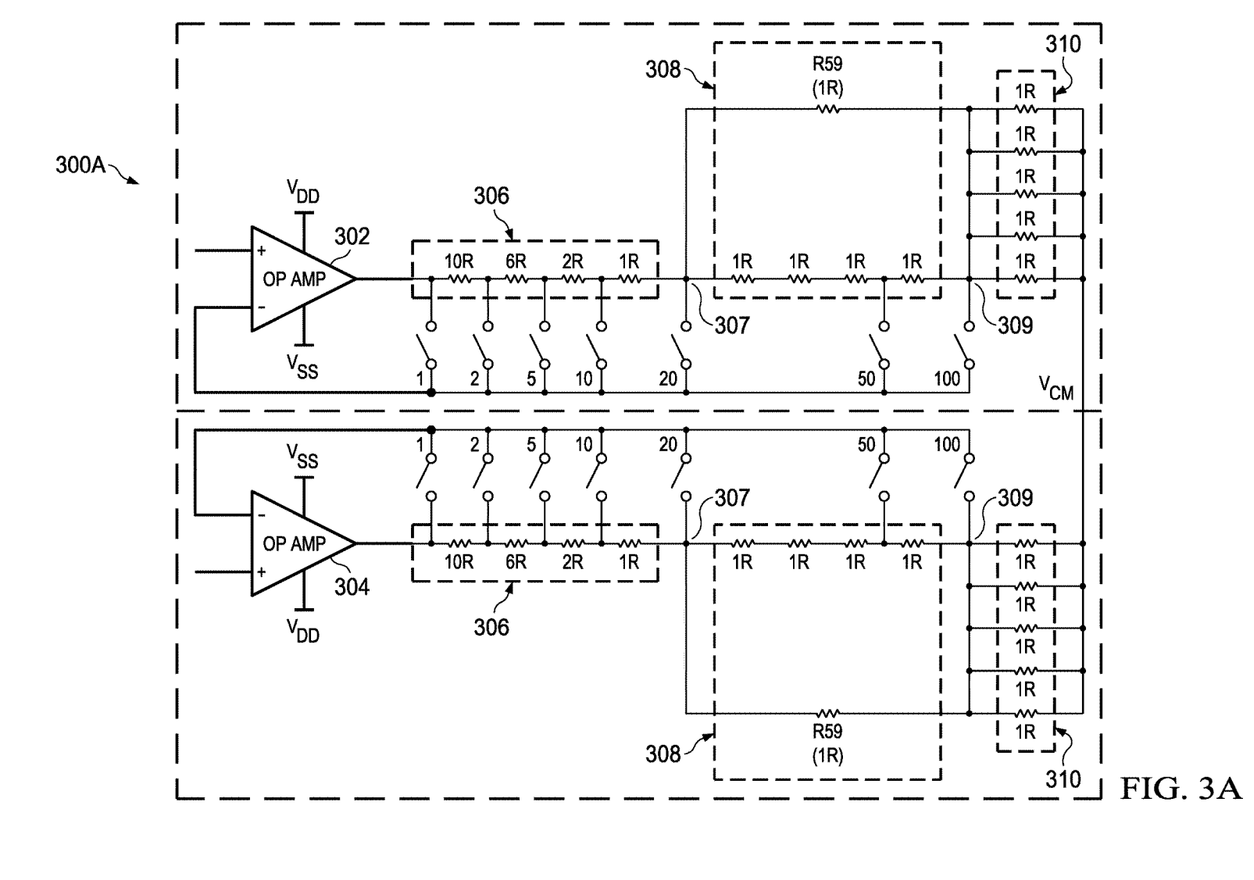
FIG. 3A depicts an implementation of a PGA according to an embodiment of the disclosure.
Figure 3B:
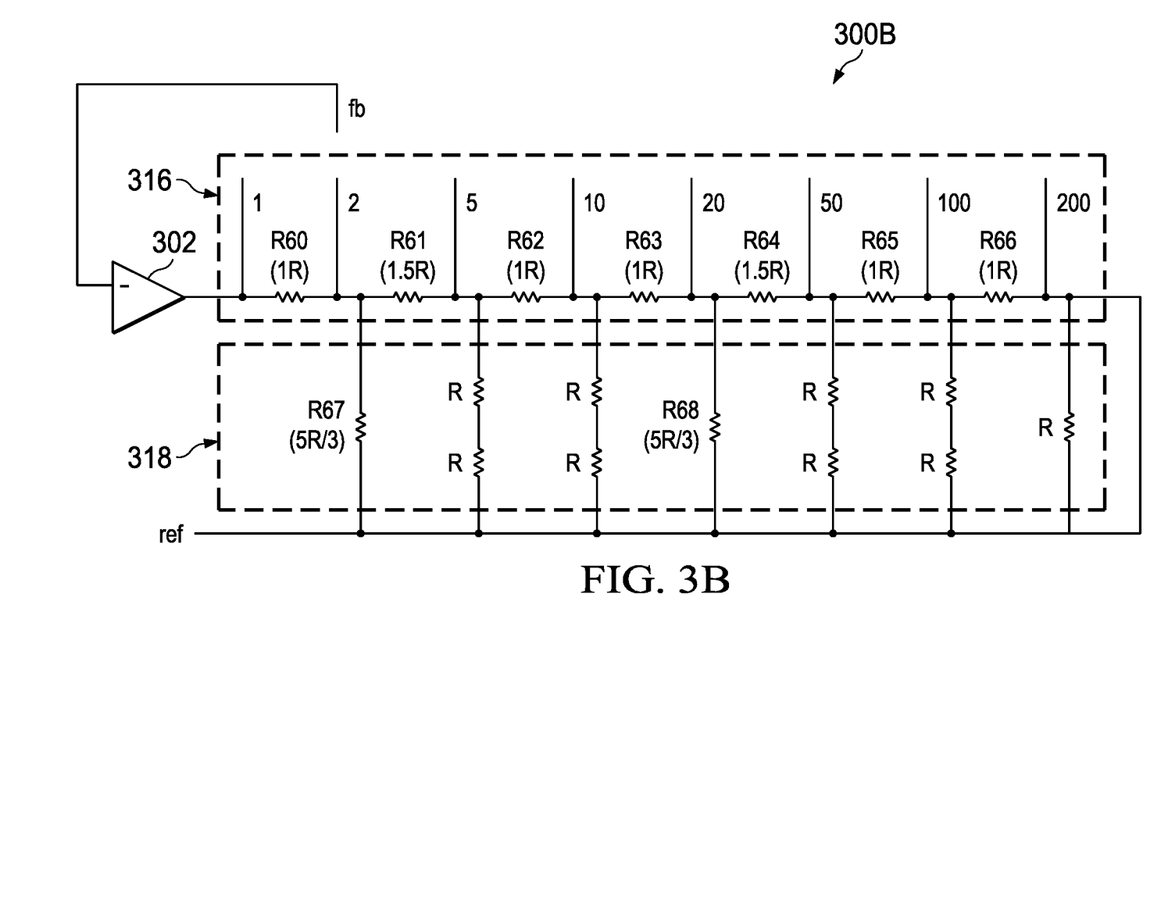
FIG. 3B depicts a prior art implementation of a PGA having the same programmable gain as in FIG. 3A.

The examples in FIGS. 1A-1C disclose single-ended PGAs, but it will be understood that the disclosed concepts are also applicable to PGAs providing differential outputs. FIGS. 2A and 3A provide further examples of PGAs 200A, 300A according to embodiments of the disclosure, while FIGS. 2B and 3B provide examples of the prior art PGAs 200B, 300B that can be replaced by PGAs 200A, 300A. Both of PGAs 200A, 200B offer programmable gain from 1 to 32. Other than providing differential outputs, PGAs 200A and 200B are shorter versions of the previously presented PGAs 100A and 100B respectively. Each of operational amplifiers 202, 204 in PGA 200B has a resistor array 216 that includes six resistors coupled in series and having respective resistances of 32R, 16R, 8R, 4R, 2R, and 1R for a total resistance of 64R, giving PGA 200B a total resistance of 128.

In contrast, each operational amplifier 202, 204 of PGA 200A includes a resistor array with three resistor sets 206, 208, 210. Resistor set 206 includes three resistors coupled in series between the output node of the operational amplifier and a first node 212 and having respective resistances of 4R, 2R and 1R. Second resistor set 208 includes three resistors coupled in series between node 212 and node 214 and a further resistor coupled in parallel to the three resistors between node 212 and node 214. Finally, the third set 210 includes four resistors coupled in parallel between node 214 and a common mode voltage $V_{CM}$; each of the resistors in the second and third sets has a resistance of 1R. The resistor arrays in the respective feedback loops of operational amplifiers 202, 204 in PGA 200A each requires a resistance of 15R for a total resistance in PGA 200A of 30R. As in the prior comparison, when the two implementations are designed with equal drive currents, PGA 200A requires much less area than PGA 200B. When compared to PGA 200B with equal drive currents, the embodiment of PGA 200A requires a much smaller number of units of resistance and achieves better matching. When the implementations are designed with equal values of $R_{UNIT}$, PGA 200A occupies much less area than PGA 200B.

FIGS. 3A and 3B depict embodiments of PGAs 300A, 300B in which a gain of 1, 2, 5, 10, 20, 50 or 100 can be selected, with PGA 300A receiving a differential signal while PGA 300B is single-ended. PGA 300B is similar to PGA 100C in that the feedback loop for operational amplifier 302 includes a set of resistors 316 coupled in series and a set of resistors 318 coupled in parallel between ones of the series-coupled resistors and a reference voltage. In resistor set 316, resistors R60, R62, R63, R65, R66 each have resistance R, while resistors R61, R64 each have resistance of 1.5R. In resistor set 318, all resistors have resistance of 1R except for resistors R67, R68, which each have resistance of 5R/3. PGA 300B has a total resistance of about 20R.

PGA 300A has the same general layout as in FIG. 1A, but different resistor values. Each of operational amplifiers 302, 304 has a feedback loop that incorporates three sets of resistors 306, 308, 310. Resistor set 306 includes four resistors having respective values of 10R, 6R, 2R and 1R, which are coupled in series between the output node of the respective operational amplifier and a node 307. Resistor set 308 includes four resistors coupled in series between node 307 and node 309, each having resistance of 1R, and resistor R59, which has a resistance of 1R and is coupled in parallel with the remaining resistors in resistor set 308 between node 307 and node 309. Third resistor set 310 includes five resistors coupled in parallel between node 309 and reference voltage $V_{CM}$. Depending on the design parameters utilized, PGA 300A can be implemented in less area or can require lower power to operate than PGA 300B.

Figure 4A:
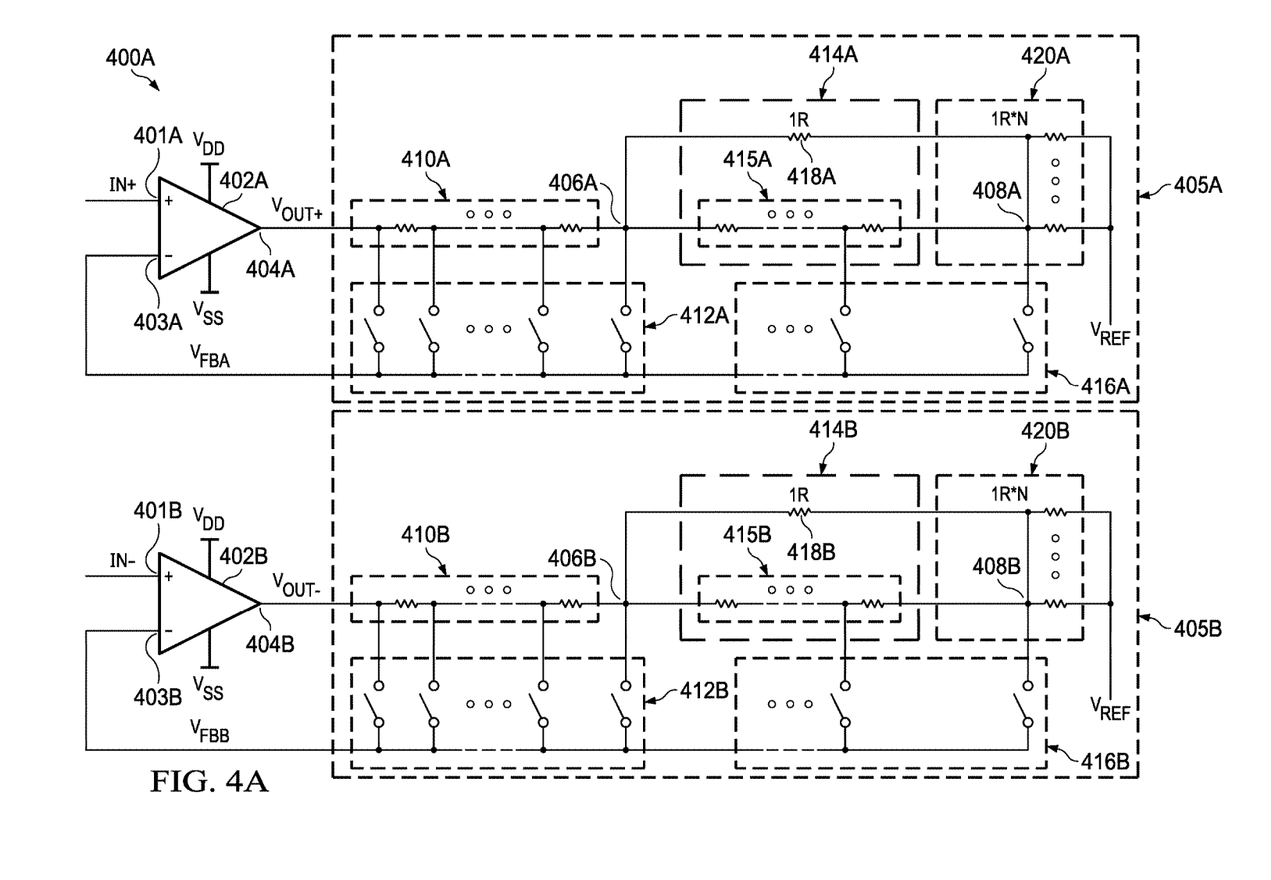
FIG. 4A depicts a generalized implementation of a PGA according to an embodiment of the disclosure.

FIG. 4A depicts a generalized PGA 400A according to an embodiment of the disclosure. PGA 400A includes operational amplifiers 402A, 402B, each having a respective resistor network 405A, 405B as part of a feedback loop. Each of operational amplifiers 402A, 402B includes a non-inverting input node 401, an inverting input node 403 and an output node 404. Each resistor network 405 includes three resistor sets 410, 414, 420. Resistor set 410 includes M resistors coupled in series between output node 404 of operational amplifier 402 and resistor network node 406, where M is an integer greater than or equal to two. Each of the resistors in resistor set 410 can have a resistance value that is an integer multiple of $R_{UNIT}$, although that is not a requirement. A set of M+1 switches 412 are located to provide taps before and after each of the resistors in resistor set 410 so that a feedback voltage $V_{FB}$ can be provided to the inverting input 403 of operational amplifier 402.

Resistor set 414 includes N−1 resistors 415 coupled in series between resistor network node 406 and resistor network node 408, where N is an integer, and also includes resistor 418, which is coupled between resistor network node 406 and resistor network node 408 in parallel with resistors 415. Each of the resistors in resistor set 414 is a unit resistor. Switches 416 are generally not located after each of the series-coupled resistors in resistor set 415, but rather are placed after selected resistors in resistor set 415 to provide appropriate values for feedback voltage $V_{FB}$ and determine desired gain. Finally, resistor set 420 includes N resistors coupled in parallel between resistor network node 408 and reference voltage $V_{REF}$, with all of the resistors in resistor network 420 being unit resistors. It will be understood that although the embodiment of FIG. 4A has been shown as a PGA that utilizes a differential signal, PGA 400A can also be implemented as a single-ended PGA. In both implementations, the layout of resistor network 405 can provide improvements in one or more of CMRR performance, gain error, smaller area for implementation and lower power requirements when compared with prior art embodiments.

Figure 4B:
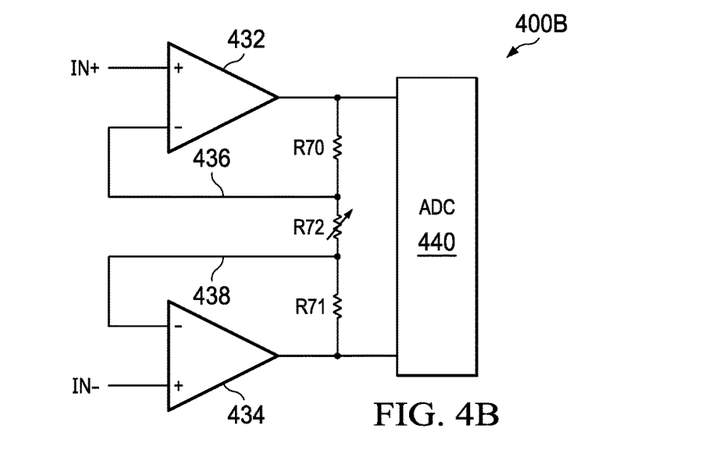
FIG. 4B depicts a schematic of a PGA that can incorporate a resistor feedback network according to the disclosed embodiments.

FIG. 4B depicts an alternate layout for a PGA 400B according to an embodiment of the disclosure. PGA 400B contains two operational amplifiers 432, 434, which are coupled to receive differential input signals IN+, IN− on respective non-inverting inputs. In this embodiment, each of operational amplifiers 432, 434 provides an output signal to ADC 440. The output node and the inverting input node of operational amplifier 432 are coupled to provide a feedback loop 436, which includes resistor R70. Similarly, the output node and the inverting input node of operational amplifier 434 are coupled to provide a feedback loop 438, which includes resistor R71. Resistor R72 is a variable resistor that is coupled between the output node of operational amplifier 432 and the output node of operational amplifier 434. By implementing resistor R72 as resistor network 405, the number of resistors and/or the size of the resistor network can be decreased while achieving the same gain as in earlier versions of resistor R72. The CMRR can be improved due to better matching of resistors.

Figure 5:
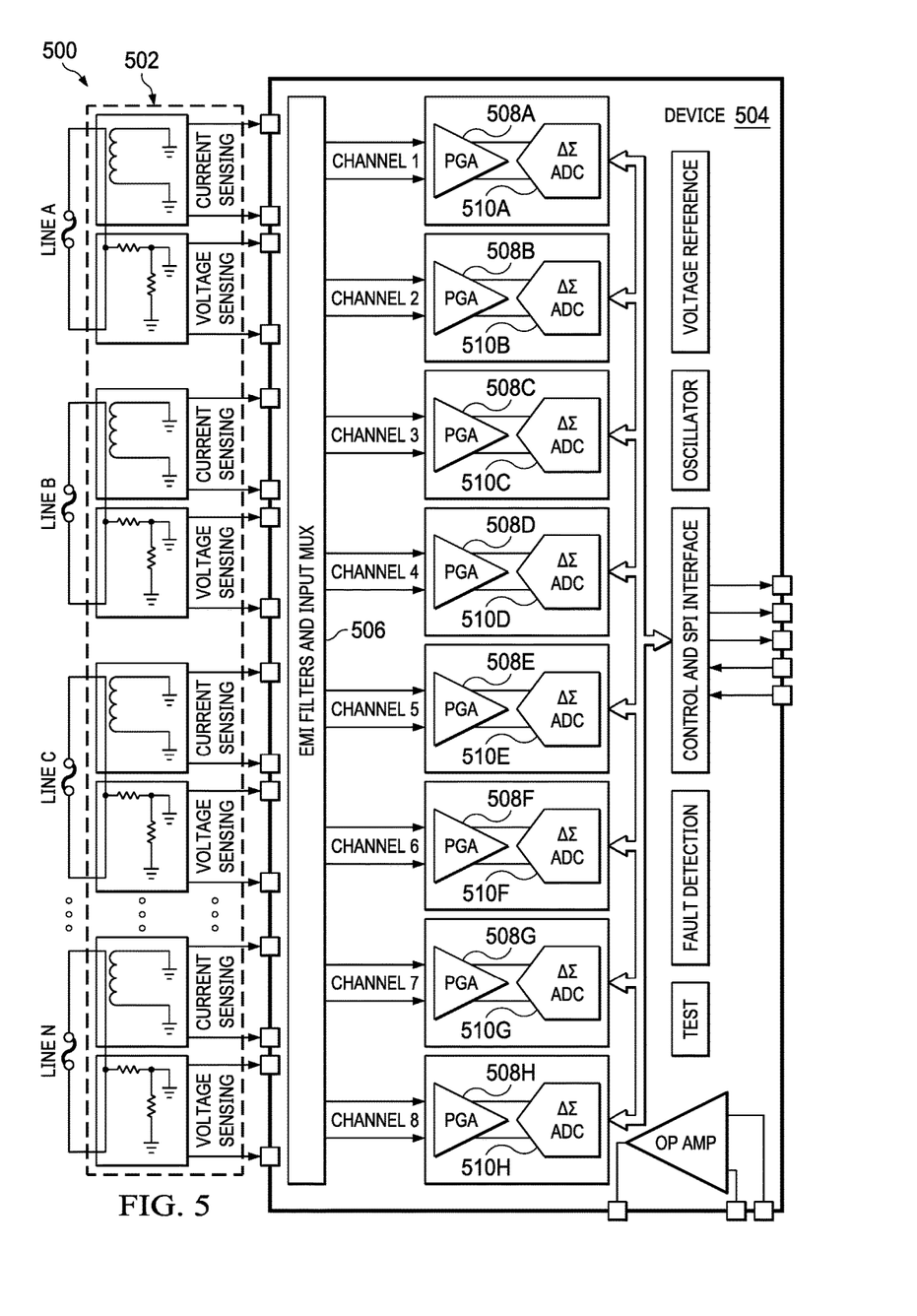
FIG. 5 depicts a schematic of an ADC in which the disclosed PGA can be utilized.

FIG. 5 depicts a schematic of an electronic device 500 that can include a number of programmable operational amplifiers according to an embodiment of the disclosure. Electronic device 500 is an analog front end that provides a multichannel, simultaneous sampling, $\Delta\Sigma$ ADC with built-in PGAs. Sensors 502 provide voltage and current sensing input to chip 504, which receives the multiple inputs at electromagnetic interference (EMI) filters and input multiplexor 506. The inputs are passed via appropriate channels to one of PGAs 508A-508H. The output from each PGA 508 is then sent to a respective $\Delta\Sigma$ ADC 510A-510H. The output from the ADC 510 is sent to a control and serial peripheral interface (SPI), where the information can be provided on chip outputs. PGAs 508 can be implemented in accordance with the embodiment of one of PGA 400A, 400B to provide the disclosed advantages in CMRR and gain error.

Figure 6:
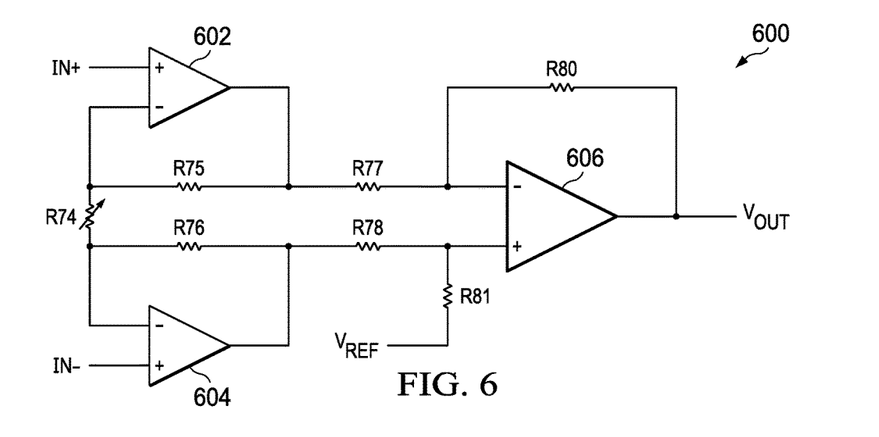
FIG. 6 depicts a schematic of a instrumentation amplifier in which the disclosed resistor network can be utilized.

FIG. 6 depicts an instrumentation amplifier 600 that can be designed with a programmable gain according to an embodiment of the disclosure. Differential signals IN+, IN− are received on the non-inverting input respectively of operational amplifier 602 and operational amplifier 604. The output of operational amplifier 602 is provided to the inverting input of operational amplifier 606 through resistor R77 and is also provided in a feedback loop through resistor R75 to the inverting input of operational amplifier 602. Similarly, the output of operational amplifier 604 is provided to the non-inverting input of operational amplifier 606 through resistor R78 and is also provided in a feedback loop through resistor R76 to the inverting input of operational amplifier 604.

Output $V_{OUT}$ of operational amplifier 606 is provided through resistor R80 to a point between resistor R77 and the inverting input of operational amplifier 606, while a point between resistor R78 and the non-inverting input of operational amplifier 606 is coupled through resistor R81 to a reference voltage $V_{REF}$. Variable resistor R74 is coupled between the output node of operational amplifier 602 and the output node of operational amplifier 604 and determines the gain of instrumentation amplifier 600. Instrumentation amplifier 600 can be implemented with programmable gain by implementing resistor R74 as resistor network 405.

Applicant has disclosed a programmable gain operational amplifier and a programmable gain instrumentation amplifier that can provide improvements in one or more of CMRR, resistor matching, gain error, area required and power required as compared to prior art PGAs providing the same selectable gain. The disclosed PGA is suitable for use with a ΔΣ ADC.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A programmable gain amplifier (PGA) comprising:
a first operational amplifier comprising a first non-inverting input node, a first inverting input node and a first output node; and
a first resistor network coupled to the first output node, the first resistor network comprising:
   a first plurality of resistors coupled in series between the first output node and a first resistor network node;
   a second plurality of resistors coupled in series between the first resistor network node and a second resistor network node;
   a first unit resistor coupled in parallel with the second plurality of resistors between the first resistor network node and the second resistor network node; and
   a third plurality of resistors coupled in parallel between the second resistor network node and a reference voltage, wherein each resistor of the second plurality of resistors and of the third plurality of resistors comprises a unit resistor and further wherein the third plurality of resistors contains a number N of resistors and the second plurality of resistors contains (N−1) resistors.

2. The PGA as recited in claim 1 further comprising:
a first plurality of switches, coupled before and after each of the first plurality of resistors, from which a first feedback voltage can be selected; and
a second plurality of switches, coupled after ones of the second plurality of resistors, from which the first feedback voltage can be selected.

3. The PGA as recited in claim 1 further comprising:
a second operational amplifier comprising a second non-inverting input node, a second inverting input node and a second output node; and
a second resistor network coupled to the second output node, the second resistor network comprising:
   a fourth plurality of resistors coupled in series between the second output node and a fourth resistor network node;
   a fifth plurality of resistors coupled in series between the fourth resistor network node and a fifth resistor network node;
   a second unit resistor coupled in parallel with the fifth plurality of resistors between the fourth resistor network node and the fifth resistor network node; and
   a sixth plurality of resistors coupled in parallel between the fifth resistor network node and the reference voltage, wherein each resistor of the fifth plurality of resistors and of the sixth plurality of resistors comprises a unit resistor and further wherein the sixth plurality of resistors contains N resistors and the fifth plurality of resistors contains (N−1) resistors.

4. The PGA as recited in claim 3 further comprising:
a first plurality of switches, coupled before and after each of the first plurality of resistors, from which a first feedback voltage can be selected; and
a second plurality of switches, coupled after ones of the second plurality of resistors, from which the first feedback voltage can be selected;
a third plurality of switches, coupled before and after each of the fourth plurality of resistors, from which a second feedback voltage can be selected; and
a fourth plurality of switches, coupled after ones of the fifth plurality of resistors, from which the second feedback voltage can be selected.

5. The PGA as recited in claim 2 wherein the first resistor network is coupled between the first output node and the first inverting input node to provide the first feedback voltage.

6. The PGA as recited in claim 4 wherein the first resistor network is coupled between the first output node and the first inverting input node to provide the first feedback voltage and the second resistor network is coupled between the second output node and the second inverting input node to provide the second feedback voltage.

7. The PGA as recited in claim 2 further comprising a second operational amplifier that comprises a second non-inverting input node, a second inverting input node and a second output node, wherein the first resistor network is coupled between the first output node and the second output node.

8. The PGA as recited in claim 4 wherein the first non-inverting input node and the second non-inverting input node are each coupled to receive one of a differential pair of signals.

9. The PGA as recited in claim 8 wherein the first output node is coupled to the first inverting input to provide the first feedback voltage and the second output node is coupled to the second inverting input to provide the second feedback voltage.

10. An electronic device comprising:
a first operational amplifier having a first inverting input node and a first non-inverting input node and being further coupled to provide a first output signal on a first output node;
a second operational amplifier having a second inverting input node and a second non-inverting input node and being further coupled to provide a second output signal on a second output node, each of the first and second operational amplifiers being coupled to receive a respective one of a pair of differential signals on a respective non-inverting input; and
a resistor network having a first terminal coupled to the first output node and a second terminal coupled to the second output node, the resistor network comprising
   a first plurality of resistors coupled in series between the first output node and a first resistor network node;
   a second plurality of resistors coupled in series between the first resistor network node and a second resistor network node;
   a first unit resistor coupled in parallel with the second plurality of resistors between the first resistor network node and the second resistor network node; and a third plurality of resistors coupled in parallel between the second resistor network node and a reference voltage.

11. The electronic device as recited in claim 10 wherein the electronic device is a programmable gain amplifier coupled to provide the first and second output signals to an analog-to-digital converter (ADC).

12. The electronic device as recited in claim 11 further comprising:
   a first feedback loop coupled between the first output node and the first inverting input node, the first feedback loop having a first resistance; and
   a second feedback loop coupled between the second output node and the second inverting input node, the second feedback loop having a second resistance.

13. The electronic device as recited in claim 10 wherein the electronic device is an instrumentation amplifier, the instrumentation amplifier further comprising a third operational amplifier coupled to receive the first output signal on a third inverting input node and to receive the second output signal on a third non-inverting input node and further coupled to provide a third output signal on a third output node.

14. The electronic device as recited in claim 13 further comprising:
   a first feedback loop coupled between the first output node and the first inverting input node, the first feedback loop having a first resistance;
   a second feedback loop coupled between the second output node and the second inverting input node, the second feedback loop having a second resistance;
   a third feedback loop coupled between the third output node and the third inverting input node, the third feedback loop having a third resistance.

15. The electronic device as recited in claim 10 further comprising:
   a first plurality of switches, coupled before and after each of the first plurality of resistors, from which a feedback voltage can be selected; and
   a second plurality of switches, coupled after ones of the second plurality of resistors, from which the feedback voltage can be selected.

\* \* \* \* \*